(12) United States Patent
Yim et al.

(10) Patent No.: US 6,734,065 B2
(45) Date of Patent: May 11, 2004

(54) METHOD OF FORMING A NON-VOLATILE MEMORY DEVICE HAVING A METAL-OXIDE-NITRIDE-OXIDE-SEMICONDUCTOR GATE STRUCTURE

(75) Inventors: Yong-Sik Yim, Kyunggi-do (KR); Jung-Dal Choi, Kyunggi-do (KR); Hong-Suk Kwack, Kyunggi-do (KR); You-Cheol Shin, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/418,848

(22) Filed: Apr. 18, 2003

(65) Prior Publication Data

US 2003/0205728 A1 Nov. 6, 2003

Related U.S. Application Data

(62) Division of application No. 10/099,581, filed on Mar. 15, 2002.

(30) Foreign Application Priority Data

Mar. 17, 2001 (KR) .......................................... 2001-13930

(51) Int. Cl.⁷ ............................................. H01L 21/336
(52) U.S. Cl. ...................... 438/257; 438/258; 438/263; 438/264; 438/265; 438/266; 257/500; 257/501; 257/502
(58) Field of Search ................................ 438/257, 258, 438/263, 264, 265, 266; 257/500, 501, 502, 316, 371, 548, 324

(56) References Cited

U.S. PATENT DOCUMENTS 5,712,178 A  *  1/1998  Cho et al. ................... 438/201
6,103,572 A     8/2000  Kirihara

* cited by examiner

*Primary Examiner*—Son L. Mai
*Assistant Examiner*—Long Tran
(74) *Attorney, Agent, or Firm*—Marger Johnson & McCollom, P.C.

(57) ABSTRACT

Embodiments of the invention provide a method that includes forming a selection transistor and a cell transistor that includes a cell gate insulation layer in a cell array area. The method also includes forming a low-voltage MOS transistor having a low-voltage gate insulation layer and a high-voltage MOS transistor having a high-voltage gate insulation layer in a peripheral circuit area. The low-voltage gate insulation layer is formed thinner than the high-voltage gate insulation layer. The low voltage gate insulation layer may also be formed thinner than the equivalent thickness of the cell gate insulation layer.

8 Claims, 11 Drawing Sheets

METHOD OF FORMING A NON-VOLATILE MEMORY DEVICE HAVING A METAL-OXIDE-NITRIDE-OXIDE-SEMICONDUCTOR GATE STRUCTURE

This application is a divisional of U.S. patent application Ser. No. 10/099,581, filed on Mar. 15, 2002, now pending, which is herein incorporated by reference in its entirety.

BACKGROUND OF THE INVENTION

1. Field of the Invention

The present invention generally relates to a semiconductor device and fabrication method thereof and, more particularly, to a non-volatile memory device having a MONOS (Metal-Oxide-Nitride-Oxide-Semiconductor) gate structure and a fabrication method thereof.

2. Description of the Related Art

Semiconductor memory devices for storing data can typically be categorized as either volatile memory devices or non-volatile memory devices. Volatile memory devices lose their stored data when their power supplies are interrupted, whereas non-volatile memory devices retain their stored data when their power supplies are interrupted. Thus, non-volatile memory devices, e.g., flash memory devices are widely used in a mobile telecommunication system or a memory card.

Generally, a stacked gate structure is employed in a cell transistor of the non-volatile memory device. The stacked gate structure includes a tunnel oxide layer, a floating gate, an inter-gate dielectric layer and a control gate, which are sequentially stacked on a channel region of the cell transistor. This stacked gate structure causes a severe step difference between a cell array region and a peripheral circuit region. Consequently, subsequent processing steps can be complicated and difficult to execute. In addition, the process for forming the floating gate is complex and it is difficult to increase a surface area of the floating gate. The surface area of the floating gate influences a coupling ratio of the cell transistor, and the coupling ratio affects the program characteristic and erase characteristic of the cell transistor. Therefore, it is required to increase the surface area of the floating gate in order to improve the program characteristic and the erase characteristic. However, in a highly integrated non-volatile memory device, there is a limit to increasing the surface area of the floating gate.

A cell transistor having a MONOS gate structure has been proposed in order to solve the above problems of the non-volatile memory device having the stacked gate structure.

A fabrication method of non-volatile memory device having the MONOS gate structure is taught in U.S. Pat. No. 6,103,572 entitled "Method of fabricating a semiconductor non-volatile storage device" by Kirihara, which is incorporated herein by reference. According to Kirihara, an interconnection electrode and a passivation layer are formed on a semiconductor substrate including a cell transistor having a MONOS gate structure, and the passivation layer is annealed at a temperature of 425° C. and in a nitrogen atmosphere. In addition, the interconnection electrode is annealed at a temperature of 380° C. and in a hydrogen atmosphere, prior to formation of the passivation layer. Thus, the annealing processes remove electric charges trapped in the MONOS gate structure during a plasma etching process for forming the interconnection electrode and a plasma CVD process for depositing the passivation layer. As a result, the initial threshold voltage of the cell transistor can be stabilized.

On the other hand, a non-volatile memory device such as a NAND type flash memory device contains low-voltage MOS transistors and high-voltage MOS transistors within a peripheral circuit area thereof, and contains cell transistors and selection transistors within a cell array area thereof. The low-voltage MOS transistors are mostly operated in a read mode, and the high-voltage MOS transistors are mainly operated in a program mode and an erase mode. Also, high voltage and low voltage are applied to the cell transistors, and low voltage is applied to the selection transistors. Therefore, in non-volatile memory devices employing the cell transistor having the MONOS gate structure, it is required to optimize gate structures of the low-voltage MOS transistors, the high-voltage MOS transistors and the selection transistors.

SUMMARY OF THE INVENTION

The present invention provides non-volatile memory devices including selection transistors, low-voltage MOS transistors and high-voltage MOS transistors as well as cell transistors having the MONOS gate structure.

According to one embodiment of the present invention, the non-volatile memory device of the invention comprises a cell array area and a peripheral circuit area. The cell array area includes a selection transistor and a cell transistor, and the peripheral circuit area includes a low-voltage MOS transistor and a high-voltage MOS transistor. The cell transistor contains a cell gate pattern having a MONOS structure. In detail, the cell gate pattern contains a cell gate insulation layer having a tunnel oxide layer, a silicon nitride layer pattern and a top oxide layer pattern, which are sequentially stacked on a semiconductor substrate, and a cell gate electrodes disposed on the cell gate insulation layer. Also, the low-voltage MOS transistor includes a low-voltage gate insulation layer and a low-voltage gate electrode, and the high-voltage MOS transistor contains a high-voltage gate insulation layer and a high-voltage gate electrode. The high-voltage gate insulation layer is a first oxide layer, and the low-voltage gate insulation layer is a second gate oxide layer, thinner than the first gate oxide layer. The thickness of the second gate oxide layer is less than the equivalent oxide thickness of the cell gate insulation layer.

In accordance with one aspect of the present invention, the selection transistor comprises a selection gate pattern having a selection gate insulation layer and a selection gate electrode, which are sequentially stacked. The selection gate insulation layer is the same material layer as the second gate oxide layer.

According to another aspect of the present invention, the selection gate insulation layer may be the same material layer as the cell gate insulation layer.

According to another embodiment of the invention, the present invention also provides a fabrication method of a non-volatile memory device including a MONOS gate structure. This method comprises forming an isolation layer on a predetermined region of a semiconductor substrate having a cell array area and a peripheral circuit area. The isolation layer defines a first active region in the cell array area and a second and third active regions in the peripheral circuit area. A tunnel oxide layer, a silicon nitride layer and a top oxide layer are sequentially formed on the surface of the substrate having the isolation layer. The top oxide layer, the silicon nitride layer and the tunnel oxide layer are patterned to form a cell gate insulation layer covering the first active region and expose the active regions of the peripheral circuit area, i.e., the second and third active regions of the peripheral circuit area. The cell gate insulation layer includes the patterned tunnel oxide layer, the pattern silicon nitride layer and the patterned top oxide layer. At this time, a portion of the first active region, i.e., a first area can be exposed. Thus, the cell gate insulation layer may cover only a second area of the first active region.

A first gate oxide layer is formed on the exposed second and third active regions. At this time, if the first area of the first active region is exposed, the first gate oxide layer is also formed on the exposed first area. The first gate oxide layer is then patterned to expose the second active region. At this time, if the first gate oxide layer is formed on the exposed first area, the first area is also exposed.

A second gate oxide layer, which is thinner than the first gate oxide layer, is formed on the exposed second active region. If the first area is exposed by patterning the first gate oxide layer, the second gate oxide layer is also formed on the first area. The thickness of the second gate oxide layer is less than the equivalent oxide thickness of the cell gate insulation layer.

In addition, a conductive layer is formed on the entire surface of the substrate including the second gate oxide layer. The conductive layer is patterned to form a cell gate electrode crossing over the second area of the first active region, a selection gate electrode crossing over the first area of the first active region, a low-voltage gate electrode crossing over the second active region and a high-voltage gate electrode crossing over the third active region.

BRIEF DESCRIPTION OF THE DRAWINGS

The above and other objects and advantages of the present invention will become readily apparent from the description that follows, with reference to the accompanying drawings, in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervention layers may also be present. Moreover, each embodiment described and illustrated herein includes its complementary conductivity type embodiment as well.

Figure 1:
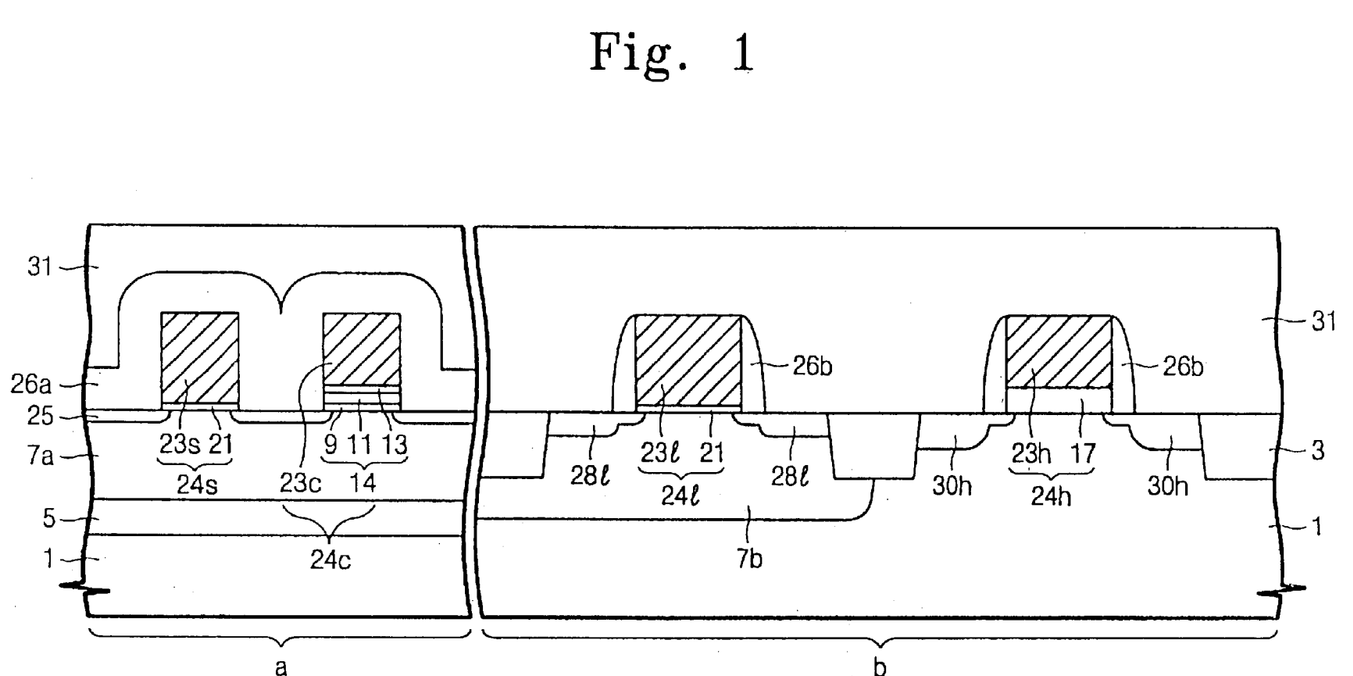
FIG. 1 is a sectional view of a non-volatile memory device in accordance with an embodiment of the present invention.
Figure 2:
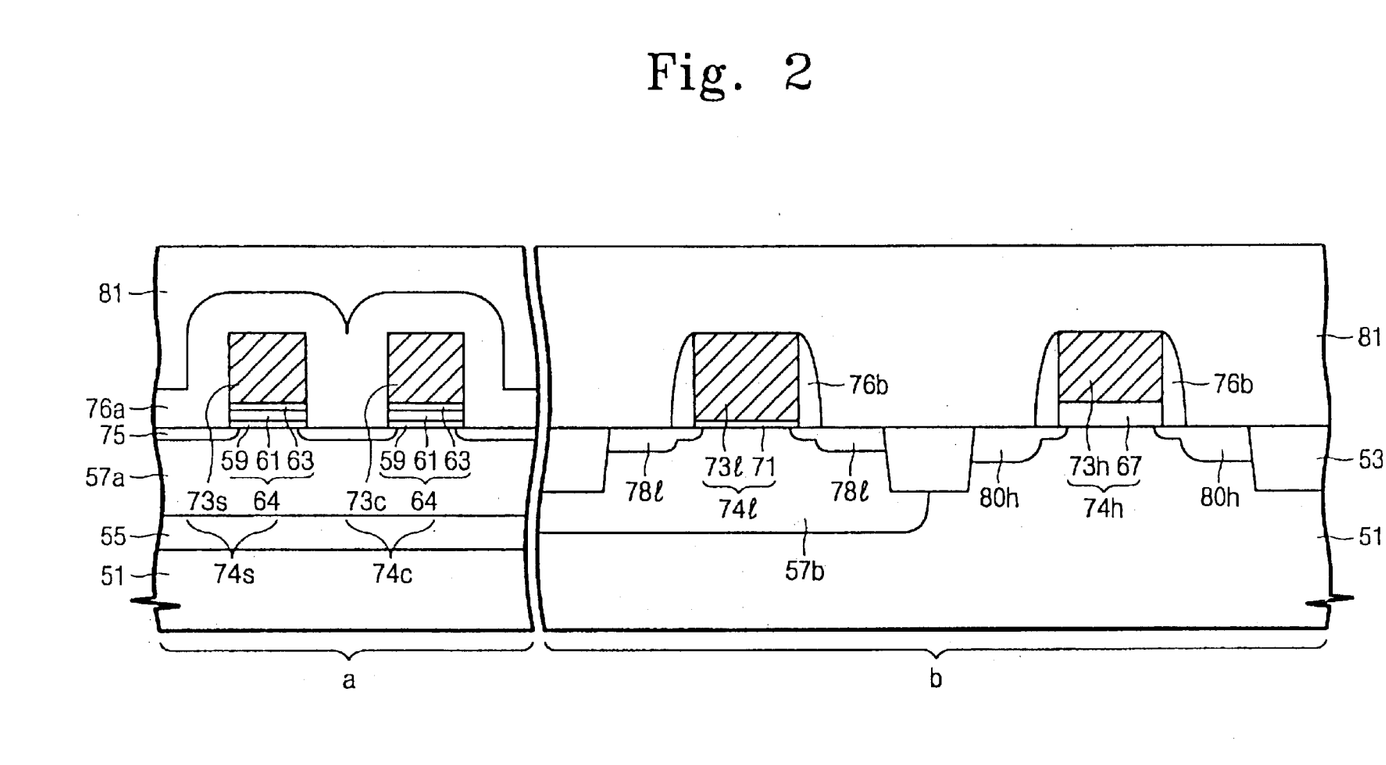
FIG. 2 is a sectional view of a non-volatile memory device in accordance with another embodiment of the present invention.

FIG. 1 is a sectional view illustrating the structure of a non-volatile memory device in accordance with an embodiment of the present invention, and FIG. 2 is a sectional view illustrating the structure of a non-volatile memory device in accordance with a second embodiment of the present invention. In each drawing, the reference characters "a" and "b" represent a cell array area and a peripheral circuit area, respectively.

Referring to FIG. 1, an isolation layer 3 is formed on predetermined regions of a semiconductor substrate 1. The isolation layer 3 defines a first active region in the cell array area a, and second and third active regions in a peripheral circuit area b. It is preferable that a first well 5, a second well 7b, and a pocket well 7a be formed in the semiconductor substrate 1 using a triple well technique. The first well 5 is formed in the cell array area a, and surrounds the pocket well 7a. Also, the second well 7b surrounds the second active region of the peripheral circuit area b. The first well 5 is doped with impurities of a conductivity type opposite to that of the semiconductor substrate 1. The pocket well 7a and the second well 7b are doped with impurities of the same conductivity type as the semiconductor substrate 1. Therefore, if the semiconductor substrate 1 is a p-type substrate, the first well 5 is an n-type well, and the pocket well 7a and the second well 7b are p-type wells. As a result, the pocket well 7a is electrically isolated from the semiconductor substrate 1. Also, the second well 7b has an impurity concentration, which is higher than that of the semiconductor substrate 1.

A high-voltage gate pattern 24h is located on a predetermined area of the third active region. The high-voltage gate pattern 24h is composed of a high-voltage gate insulation layer 17 and a high-voltage gate electrode 23h, which are sequentially stacked. It is preferable that the high-voltage gate insulation layer 17 be a first gate oxide layer thick enough to endure a high voltage such as a program voltage or an erase voltage of a non-volatile memory device. For instance, the first gate oxide layer has a thickness of 200 angstroms to 400 angstroms. The sidewall of the high-voltage gate pattern 24h is covered with a gate spacer 26b. High-voltage source/drain regions 30h are formed in the third active region, which is located on either side of the high-voltage gate pattern 24h. Preferably, the high-voltage source/drain regions 30h have an LDD shape. The high-voltage gate pattern 24h and the high-voltage source/drain regions 30h constitute a high-voltage MOS transistor.

A low-voltage gate pattern 24l is located on a predetermined area of the second active region. The low-voltage gate pattern 24l includes a low-voltage gate insulation layer 21 and a low-voltage gate electrode 23l, which are sequentially stacked. It is preferable that the low-voltage gate insulation layer 21 be a second gate oxide layer thinner than the first gate oxide layer. For example, the second gate oxide layer has a thickness of 50 angstroms to 100 angstroms. The sidewall of the low-voltage gate pattern 24l is covered with a gate spacer 26b. Low-voltage source/drain regions 28l are formed in the second active region on either side of the low-voltage gate pattern 24l. Preferably, the low-voltage source/drain regions 28l have an LDD shape. It is preferable that the low-voltage source/drain regions 28l be shallower than the high-voltage source/drain regions 30h. The low-voltage gate pattern 24l and the low-voltage source/drain regions 28l constitute a low-voltage MOS transistor.

A cell gate pattern 24c is disposed on a portion of the first active region, i.e., a first area. The cell gate pattern 24c comprises a cell gate insulation layer 14 and a cell gate electrode 23c, which are sequentially stacked. The cell gate insulation layer 14 may be a tunnel oxide layer 9, a silicon nitride layer pattern 11 and a top oxide layer pattern 13, which are sequentially stacked. However, the cell gate insulation layer 14 may be composed of other dielectric materials suitable for the present invention. The cell gate electrode 23c crosses over the first area. Also, a selection gate pattern 24s is disposed on another portion of the first active region, i.e., a second area. The selection gate pattern 24s comprises a selection gate insulation layer 21 and a selection gate electrode 23s, which are sequentially stacked. The selection gate electrode 23s extends across the second area.

The cell gate electrode 23c runs parallel with the selection gate electrode 23s. Low-concentration source/drain regions 25 are formed in the first active region, which is located on either side of the selection gate pattern 24s and the cell gate pattern 24c. The low-concentration source/drain regions 25 have an impurity concentration lower than that of the low-voltage source/drain regions 28l and the high-voltage source/drain regions 30h. The selection gate pattern 24s and the low-concentration source/drain regions 25 on either side thereof constitute a selection transistor, and the cell gate pattern 24c and the low-concentration source/drain regions 25 at both sides thereof constitute a cell transistor. The selection transistor corresponds to a string selection transistor or a ground selection transistor of a NAND type flash memory device.

The cell array area a including the selection transistor and the cell transistor is covered with a spacer insulation layer pattern 26a. The semiconductor substrate including the spacer insulation layer pattern 26a, the low-voltage MOS transistor and the high-voltage MOS transistor is covered with an interlayer dielectric layer 31.

Referring to FIG. 2, an isolation layer 53, a first well 55, a pocket well 57a and a second well 57b are disposed in a semiconductor substrate 51. The isolation layer 53, the first well 55, the pocket well 57a and the second well 57b have the same structures as the embodiment shown in FIG. 1. Low-voltage MOS transistor and high-voltage MOS transistor are arranged in the peripheral circuit area b. The low-voltage MOS transistor has the same structure as the embodiment of FIG. 1. That is, the low-voltage MOS transistor comprises a low-voltage gate pattern 74l formed on a second active region in a second well 57b and low-voltage source/drain regions 78l formed at the second active region which is located on both sides of the low-voltage gate pattern 74l. The low-voltage gate pattern 74l is composed of a low-voltage gate insulation layer 71 and a low-voltage gate electrode 73l, which are sequentially stacked. It is preferable that the low-voltage insulation layer 71 be a thin oxide layer having a thickness of 50 angstroms to 100 angstroms, like the embodiment of FIG. 1.

The high-voltage MOS transistor also has the same structure as the embodiment of FIG. 1. Namely, the high-voltage MOS transistor comprises a high-voltage gate pattern 74h formed on a third active region in the peripheral circuit area b and high-voltage source/drain regions 80h formed at the third active region which is located on both sides of the high-voltage gate pattern 74h. The high-voltage gate pattern 74h is composed of a high-voltage gate insulation layer 67 and a high-voltage gate electrode 73h, which are sequentially stacked. The high-voltage gate insulation layer 67 is formed of a thick oxide layer having a thickness of 200 angstroms to 400 angstroms, like the embodiment of FIG. 1. The sidewalls of the high-voltage gate pattern 74h and the low-voltage gate pattern 74l are covered with spacer 76b.

A selection transistor and a cell transistor are disposed in the cell array area a. The cell transistor has the same structure as the embodiment of FIG. 1. That is to say, the cell transistor comprises a cell gate insulation layer 64 and a cell gate electrode 73c, which are sequentially stacked on a first area of the first active region defined within the pocket well 57a, and the cell gate insulation layer 64 is composed of a tunnel oxide layer 59, a silicon nitride layer pattern 61 and a top oxide layer pattern 63, which are sequentially stacked. The equivalent oxide thickness of the cell gate insulation layer 64 is greater than the thickness of the low-voltage gate insulation layer 71.

On the other hand, the selection transistor has the same structure as the cell transistor, unlike the embodiment of FIG. 1. Namely, the selection transistor comprises a selection gate pattern 74s composed of the cell gate insulation layer 64 and a selection gate electrode 73s which are sequentially stacked on a second area of the first active region. Low-concentration source/drain regions 75 are formed in the first active region, which is located on both sides of the selection gate pattern 74s and the cell gate pattern 74c.

The cell array area a including the selection transistor and the cell transistor is covered with a spacer insulation layer pattern 76a. Also, the entire surface of the semiconductor substrate including the spacer insulation layer pattern 76a, the low-voltage MOS transistor and the high-voltage MOS transistor is covered with an interlayer dielectric layer 81.

Next, a fabrication method of a non-volatile memory device in accordance with an embodiment of the present invention is described with reference to FIGS. 3 through 11. In each drawing, portions indicated with reference numerals "a" and "b" represent a cell array area and a peripheral circuit area, respectively.

FIGS. 3 through 7 are sectional views for illustrating a method for fabricating a non-volatile memory device shown in FIG. 1, and FIGS. 8 through 11 are sectional views for illustrating a method of fabricating a non-volatile memory device shown in FIG. 2.

Figure 3:
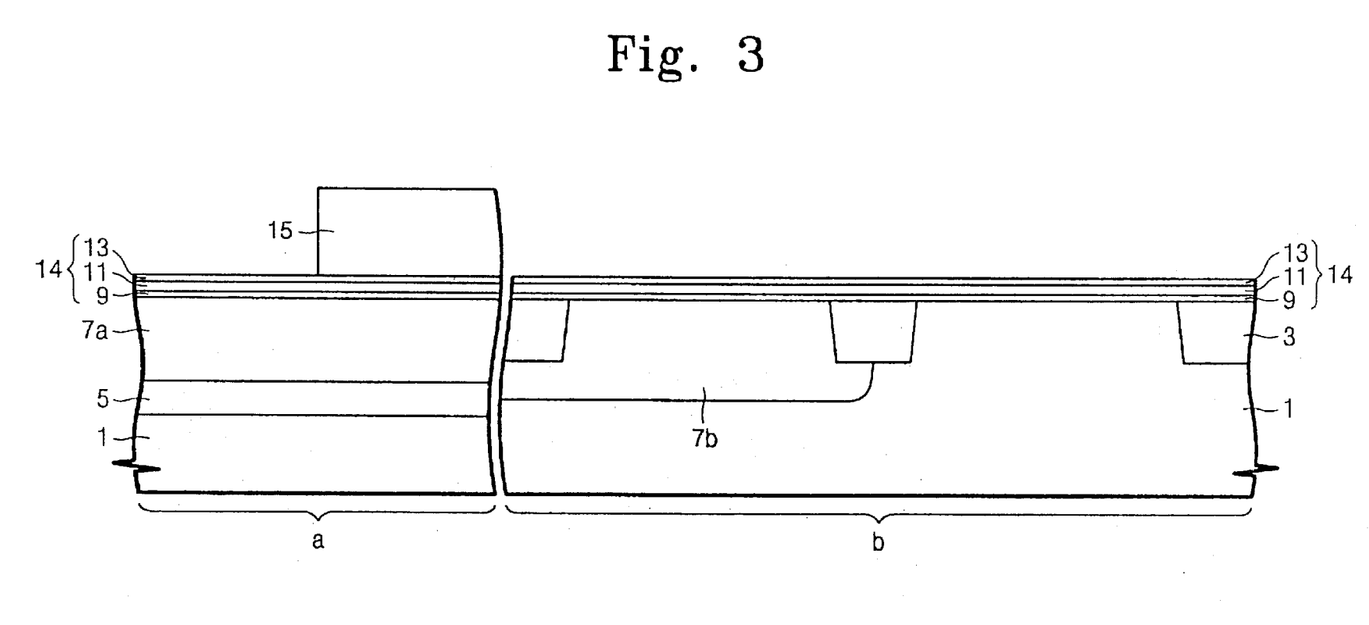
FIGS. 3 through 7 are sectional views illustrating a fabrication method of a non-volatile memory device in accordance with the embodiment of the present invention disclosed in FIG. 1.

Referring to FIG. 3, an isolation layer 3 is formed at a predetermined area of a P-type semiconductor substrate 1, thereby defining a first active region in the cell array area a and a second active region and a third active region in the peripheral circuit area b. N-type impurities are implanted into the semiconductor substrate 1 in the cell array area a, to thereby form a first well 5 of an N-type. P-type impurities are implanted into the first well 5 and a portion of the peripheral circuit area b to form a P-type pocket well 7a surrounded by the first well 5 and a second well 7b of a P-type surrounding the second active region. The first well 5, the second well 7b and the pocket well 7a may be formed using a conventional triple well process. As a result, the pocket well 7a is electrically isolated from the semiconductor substrate 1, and the second well 7b has impurity concentration, which is higher than that of the semiconductor substrate 1.

A cell gate insulation layer 14 is formed on the surface of the semiconductor substrate having the first well 5, the second well 7b and the pocket well 7a. The cell gate insulation layer 14 is formed by sequentially depositing a tunnel oxide layer 9, a silicon nitride layer 11 and a top oxide layer 13. The top oxide layer 13 can be formed by thermally oxidizing the silicon nitride layer 11 or depositing a CVD oxide layer on the silicon nitride layer 11. A first photoresist pattern 15 covering a first area of the first active region is formed on the top oxide layer 13.

Figure 4:
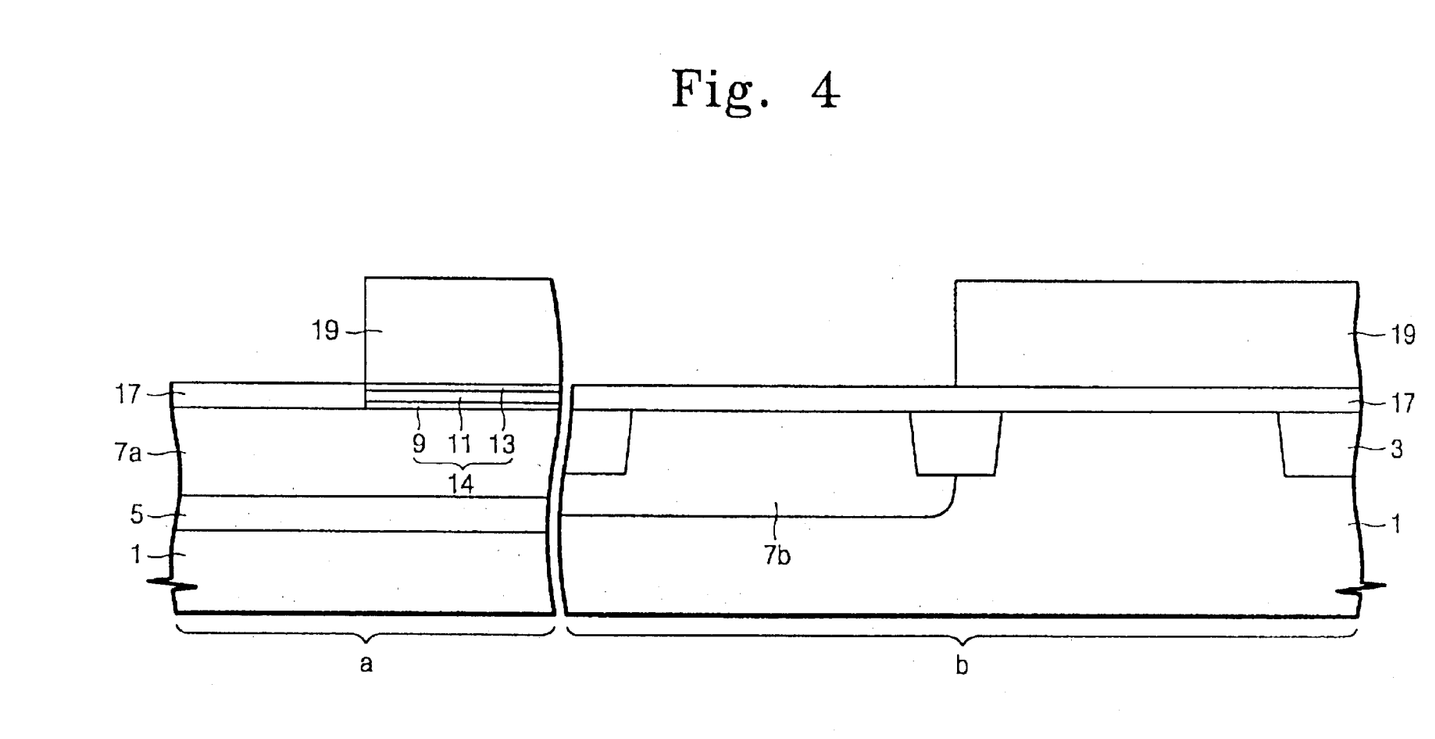

Referring to FIG. 4, the cell gate insulation layer 14 is etched using the first photoresist pattern 15 as an etching mask, thereby exposing the second and third active regions in the peripheral circuit area b and a second area of the first active region. Accordingly, the cell gate insulation layer 14 exists only on the first area adjacent to the second area, as shown in FIG. 4. The first photoresist pattern 15 is then removed. The resultant structure where the first photoresist pattern 15 is removed is thermally oxidized to form a high-voltage gate insulation layer 17, i.e., a first gate oxide layer on the exposed second and third active regions and the exposed second area. At this time, the high-voltage gate insulation layer 17, that is, a thermal oxide layer is hardly formed on the cell gate insulation layer 14. The high-voltage gate insulation layer 17 is formed to have a thickness, which is enough to endure a program voltage or an erase voltage of a non-volatile memory device. For example, it is preferable that the high-voltage gate insulation layer 17 be a thermal oxide layer having a thickness of 200 angstroms to 400 angstroms. A second photoresist pattern 19 is then formed on a semiconductor substrate including the high-voltage gate insulation layer 17. The second photoresist pattern 19 exposes the high voltage gate insulation layer 17 on the second active region and the second area of the first active region.

Figure 5:
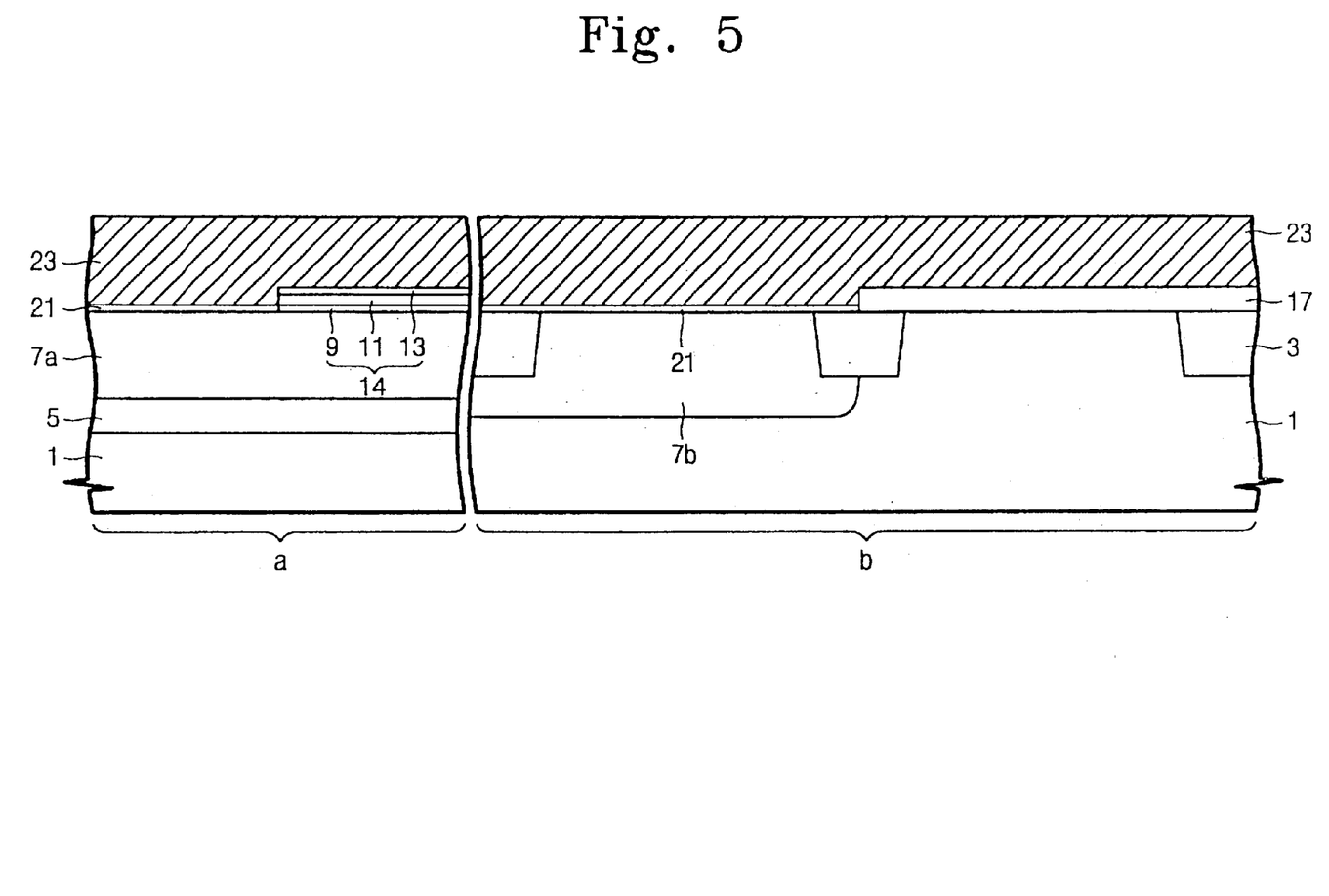

Referring to FIG. 5, the exposed high-voltage gate insulation layer 17 is etched using the second photoresist pattern 19 as an etching mask, thereby exposing the second active region and the second area of the first active region. The second photoresist pattern 19 is then removed. The resultant structure is thermally oxidized to form a low-voltage gate insulation layer 21 on the exposed second area and the exposed second active region. The low-voltage gate insulation layer 21 is formed of a second gate oxide layer, which is thinner than the high-voltage gate insulation layer 17. For instance, it is preferable that the second gate oxide layer be a thermal oxide layer having a thickness of 50 angstroms to 100 angstroms. A conductive layer 23 is formed on the surface of the semiconductor substrate including the low-voltage gate insulation layer 21. The conductive layer 23 may be a doped polysilicon layer or a metal polycide layer.

Figure 6:
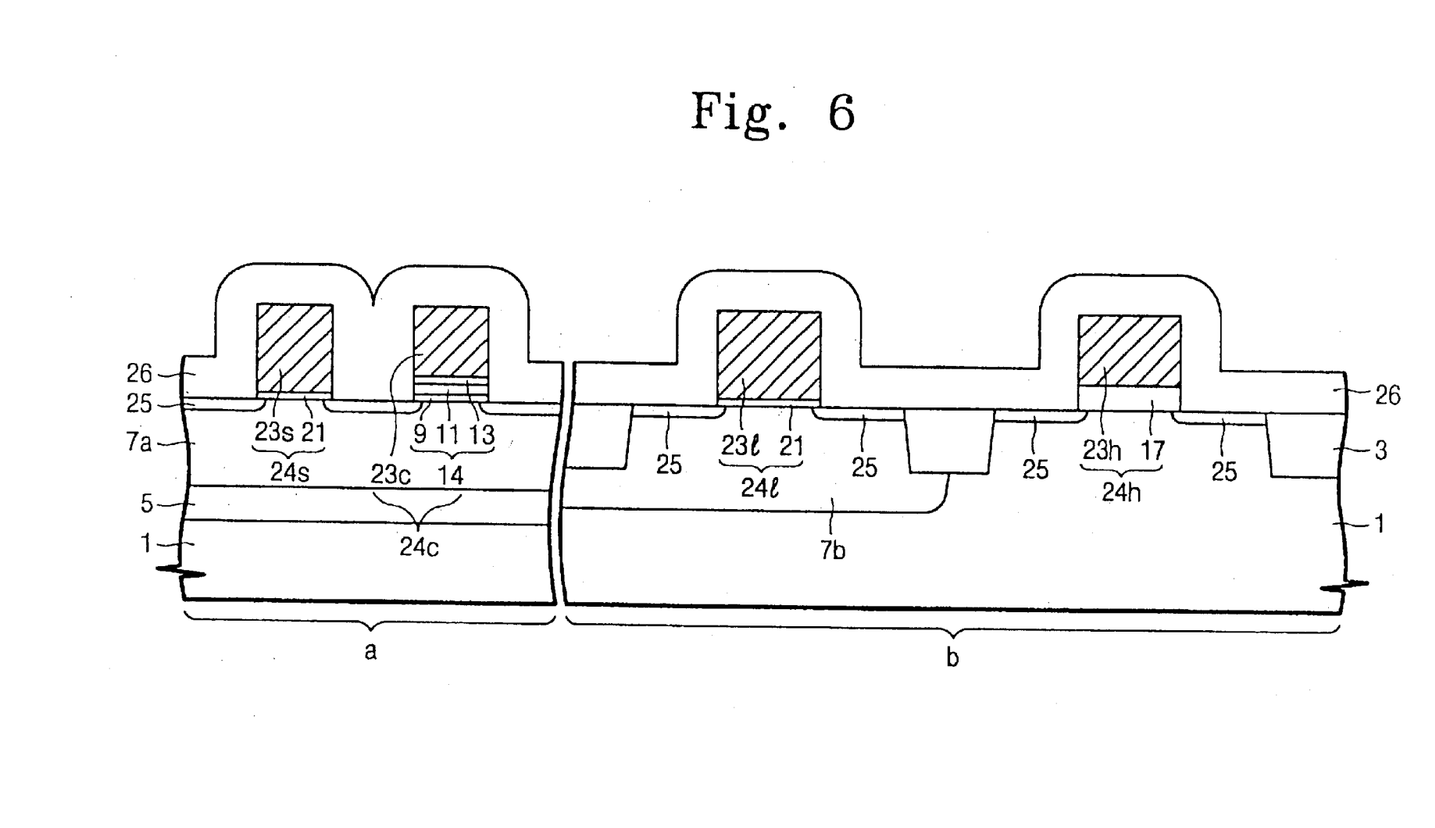

Referring to FIG. 6, the conductive layer 23 is patterned to form a cell gate electrode 23c crossing over the first area and a selection gate electrode 23s crossing over the second area and concurrently form a low-voltage gate electrode 23l crossing over the second active region and a high-voltage gate electrode 23h crossing over the third active region. The selection gate electrode 23s and the low-voltage gate insulation layer 21 thereunder constitute a selection gate pattern 24s, and the cell gate electrode 23c and the cell gate insulation layer 14 thereunder constitute a cell gate pattern 24c. Similarly, the low-voltage gate electrode 23l and the low-voltage gate insulation layer 21 thereunder constitute a low-voltage gate pattern 24l, and the high-voltage gate electrode 23h and the high-voltage gate insulation layer 17 thereunder constitute a high-voltage gate pattern 24h.

N-type impurities are implanted into the first through third active regions at a dose of $1 \times 10^{12}$ to $1 \times 10^{14}$ ion atoms/cm$^2$ using the gate electrodes 23s, 23c, 23l and 23h and the isolation layer 3 as ion implantation masks. As a result, low-concentration source/drain regions 25 are formed in the active regions on either side of the gate electrodes 23s, 23c, 23l and 23h. The low-concentration source/drain regions 25 formed in the cell array area a correspond to first source/drain regions, i.e., source/drain regions of a selection transistor and a cell transistor. A spacer insulation layer 26 is formed on the entire surface of a semiconductor substrate including the low-concentration source/drain regions 25.

Figure 7:
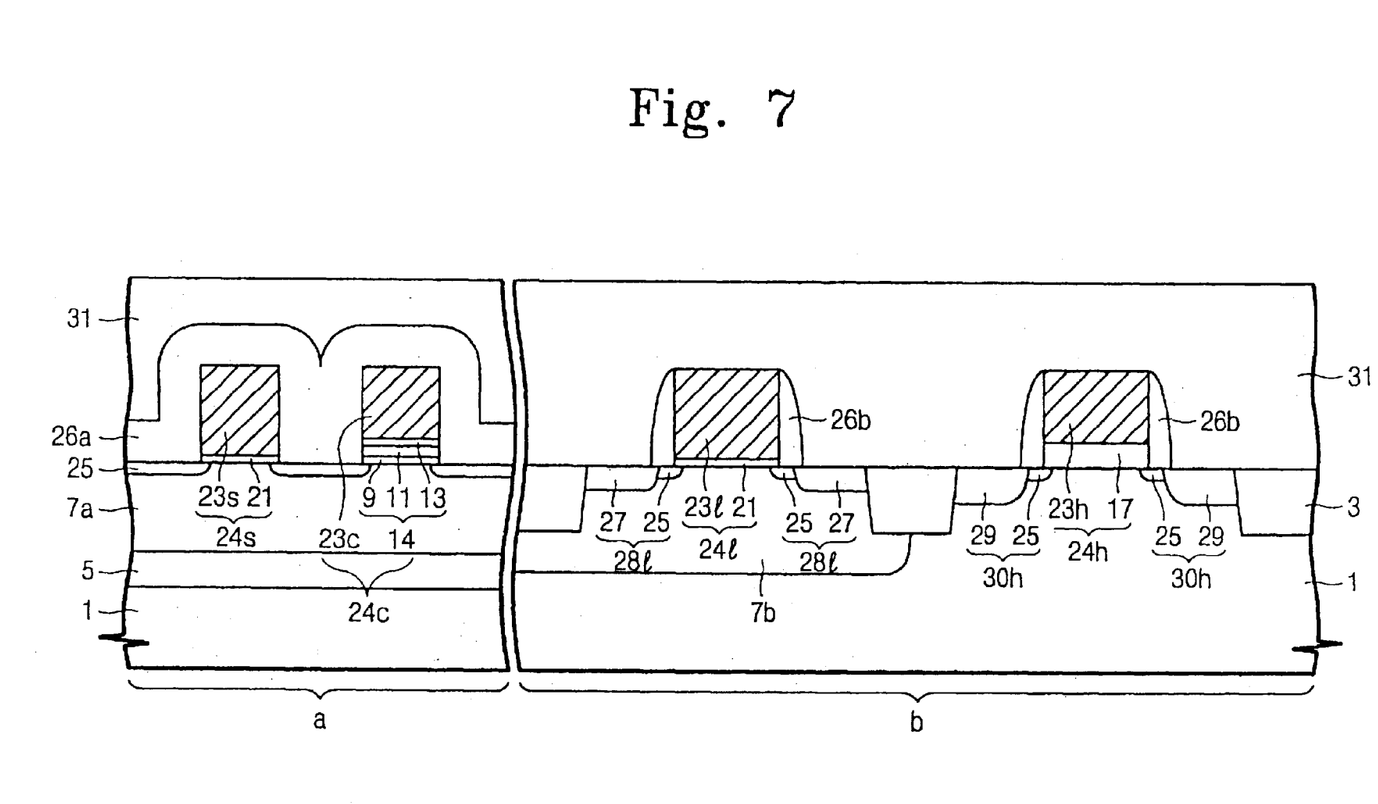

Referring to FIG. 7, the spacer insulation layer 26 in the peripheral circuit area b is anisotropically etched to form a spacer 26b on the sidewalls of the low-voltage gate pattern 24l and the high-voltage gate pattern 24h. Accordingly, a spacer insulation layer pattern 26a remains in the cell array area a. N-type impurities are then implanted into the second and third active regions at a dose of $5 \times 10^{14}$ to $5 \times 10^{15}$ ion atoms/cm$^2$ using the low-voltage gate pattern 24l, the high-voltage gate pattern 24h, the spacer 26b and the isolation layer 3 as ion implantation masks, thereby forming high-concentration source/drain regions 27 and 29. It is preferable that the high-concentration source/drain regions 29 in the third active region are deeper than the high-concentration source/drain regions 27 in the second active region.

The low-concentration source/drain regions 25 and the high-concentration source/drain regions 27, which are formed in the second active region, correspond to second source/drain regions 28l, i.e., source/drain regions of a low-voltage MOS transistor. Similarly, the low-concentration source/drain regions 25 and the high-concentration source/drain regions 29, which are formed in the third active region, correspond to third source/drain regions 30h, i.e., source/drain regions of a high-voltage MOS transistor. As a result, the second and third source/drain regions 28l and 30h shown in FIG. 7 have an LDD (lightly doped drain) structure. An interlayer dielectric layer 31 is formed on the surface of the semiconductor substrate including the high-concentration source/drain regions 27 and 29.

Although the embodiment of the present invention described above discloses a fabrication method of a non-volatile memory device having an N-channel low-voltage MOS transistor and an N-channel high-voltage MOS transistor in the peripheral circuit area, it is apparent to those skilled in the art that the present invention can be applied to a fabrication method of a non-volatile memory device having a P-channel low-voltage MOS transistor and a P-channel high-voltage MOS transistor as well as the N-channel low-voltage MOS transistor and the N-channel high-voltage MOS transistor in the peripheral circuit area.

Figure 8:
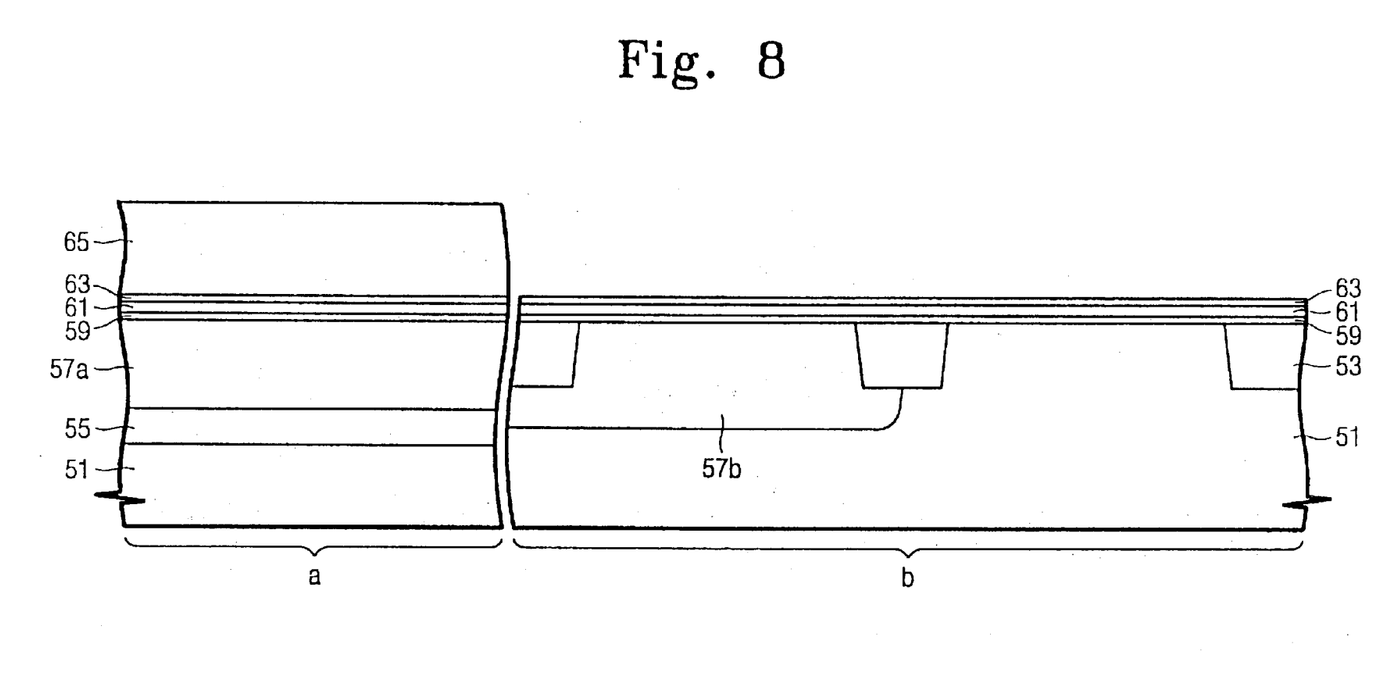
FIGS. 8 through 11 are sectional views illustrating a fabrication method of a non-volatile memory device in accordance with the embodiment of the present invention disclosed in FIG. 2.

Referring to FIG. 8, an isolation layer 53, a first well 55, a pocket well 57a and a second well 57b are formed at a P-type semiconductor substrate 51 using the same manner as described in FIG. 3. Therefore, a first active region is defined in the cell array area a, and second and third active regions are defined in the peripheral circuit area b. A cell gate insulation layer is formed on the surface of the semiconductor substrate including the isolation layer 53, the first well 55, the pocket well 57a and the second well 57b. The cell gate insulation layer is formed using the same or similar method as described in FIG. 3. Namely, the cell gate insulation layer is formed by sequentially forming a tunnel oxide layer 59, a silicon nitride layer 61 and a top oxide layer 63. A first photoresist pattern 65 covering the cell array area a is formed on the cell gate insulation layer.

Figure 9:
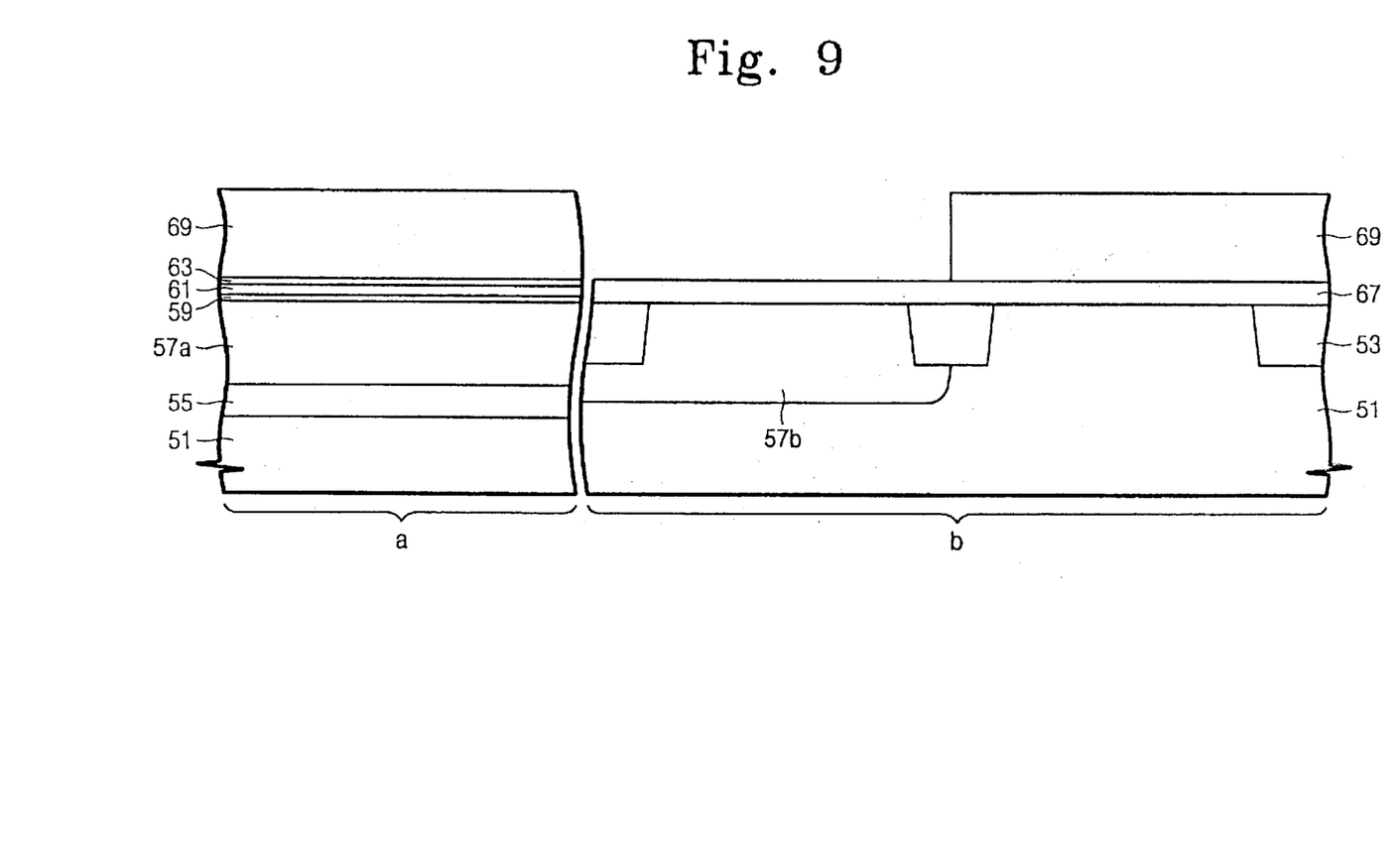

Referring to FIG. 9, the cell gate insulation layer in the peripheral circuit area b is etched using the first photoresist pattern 65 as an etching mask, thereby exposing the second and third active regions. The first photoresist pattern 65 is then removed. The resultant structure is thermally oxidized to form a high-voltage gate insulation layer 67, that is, a first gate oxide layer on the exposed second and third active regions. It is preferable that the first gate oxide layer be a thermal oxide layer having a thickness of 200 angstroms to 400 angstroms. At this time, the thermal oxide layer is barely formed on the cell gate insulation layer that exists in the cell array area a. A second photoresist pattern 69 exposing the high-voltage gate insulation layer 67 on the second active region is formed on the semiconductor substrate having the high-voltage gate insulation layer 67.

Figure 10:
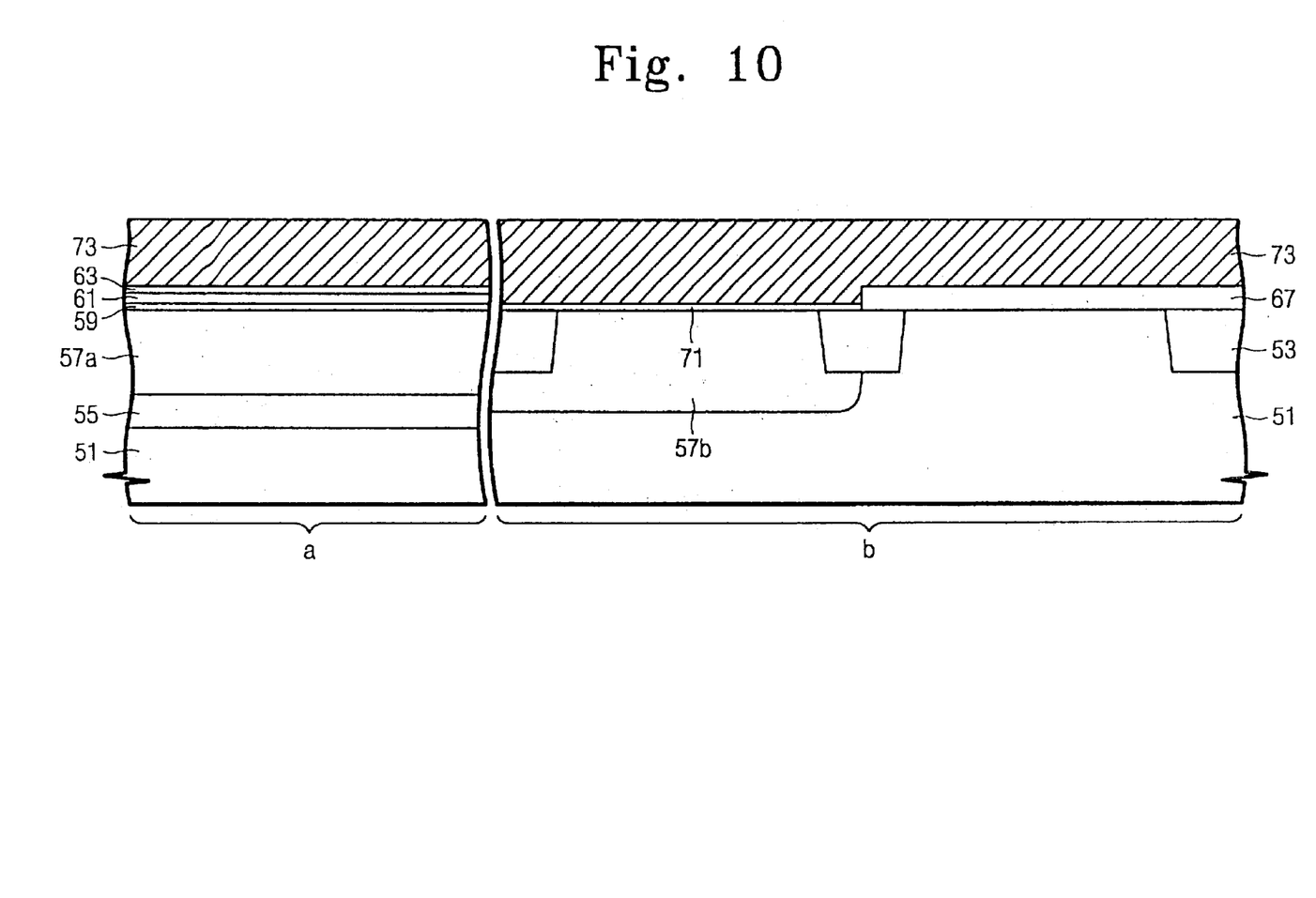

Referring to FIG. 10, the high-voltage gate insulation layer 67 is etched using the second photoresist pattern 69 as an etching mask, thereby exposing the second active region. The second photoresist pattern 69 is then removed. The resultant structure is thermally oxidized to form a low-voltage gate insulation layer 71 thinner than the high-voltage gate insulation layer 67, on the exposed second active region. The low-voltage gate insulation layer 71, i.e., a second gate oxide layer is preferably a thermal oxide layer having a thickness of 50 angstroms to 100 angstroms. A conductive layer 73 is formed on the surface of the semiconductor substrate including the low-voltage gate insulation layer 71.

Figure 11:
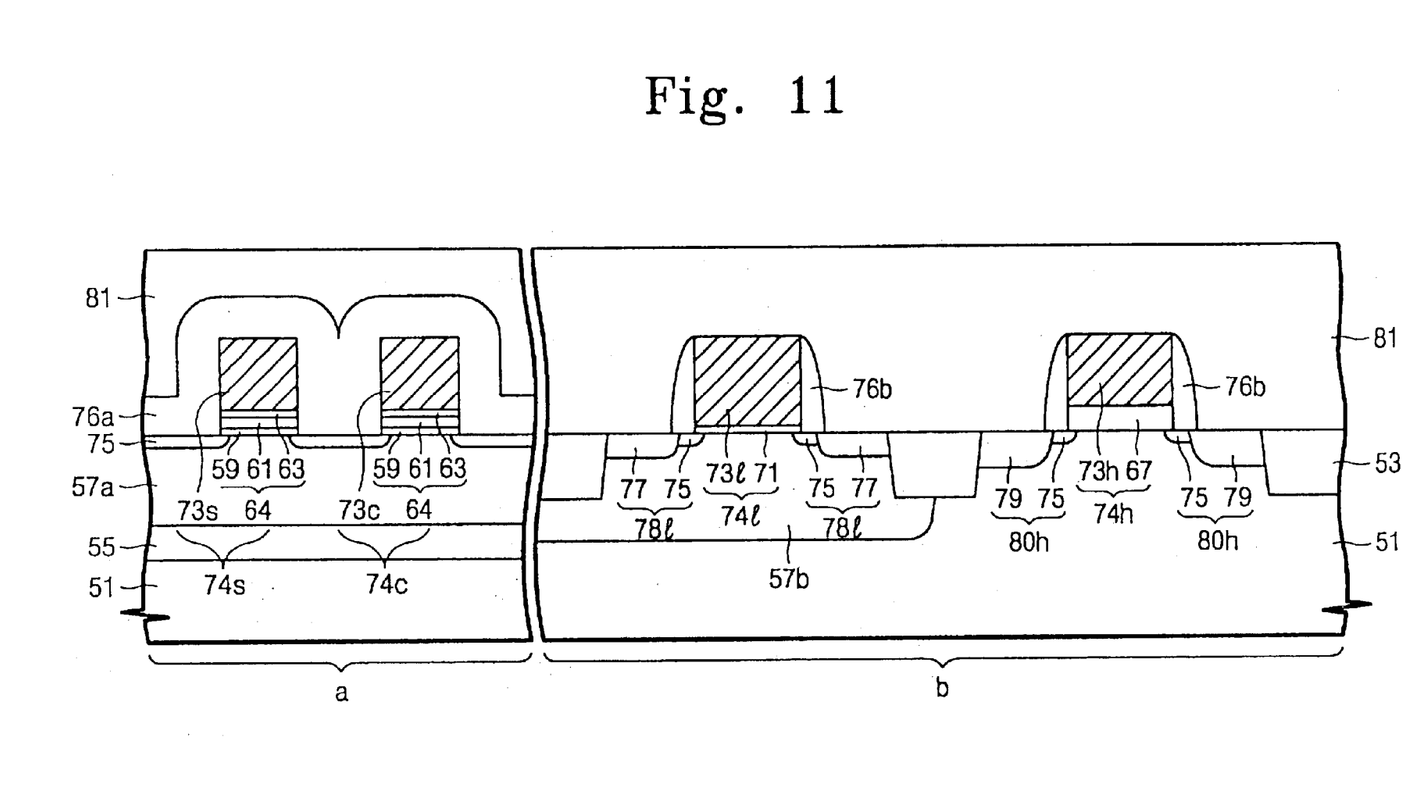

Referring to FIG. 11, the conductive layer 73 is patterned using the same or similar manner as described in FIG. 6, thereby forming a selection gate electrode 73s, a cell gate electrode 73c, a low-voltage gate electrode 73l and a high-voltage gate electrode 73h. Accordingly, a selection gate insulation layer formed under the selection gate electrode 73s is different from that of the embodiment illustrated in FIGS. 3 through 7. That is to say, the selection gate insulation layer has the same structure as a cell gate insulation layer 64 formed below the cell gate electrode 73c. In other words, the selection gate insulation layer is composed of the tunnel oxide layer 59, the silicon nitride layer pattern 61 and the top oxide layer pattern 63, which are sequentially stacked. The selection gate electrode 73s and the selection gate insulation layer 64 thereunder constitute a selection gate pattern 74s, and the cell gate electrode 73c and the cell gate insulation layer 64 thereunder constitute a cell gate pattern 74c.

A low-voltage gate pattern 74l and a high-voltage gate pattern 74h having the same structures as the first embodiment are formed in the peripheral circuit area b. The low-voltage gate pattern 74l is composed of the low-voltage gate insulation layer 71 and the low-voltage gate electrode 73l, which are sequentially stacked, and the high-voltage gate pattern 74h is composed of the high-voltage gate insulation layer 67 and the high-voltage gate electrode 73h, which are sequentially stacked.

Subsequently, a spacer insulation layer pattern 76a, a spacer 76b, first source/drain regions, second source/drain regions and third source/drain regions are formed using the same or similar manner as the first embodiment. Each of the first source/drain regions is composed of a low-concentration source/drain region 75, and each of the second source/drain regions comprises the low-concentration source/drain region 75 and a high-concentration source/drain region 77. Also, each of the third source/drain regions comprises the low-concentration source/drain region 75 and a high-concentration source/drain region 79. An interlayer dielectric layer 81 is formed on the surface of the semiconductor substrate having the first to third source/drain regions.

As described above, according to the present invention, it is possible to optimize the cell transistor, the selection transistor, the low-voltage MOS transistor and the high-voltage MOS transistor.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A method for fabricating a non-volatile memory device on a semiconductor substrate having a cell array area and a peripheral circuit area, the method comprising:

forming an isolation layer on the semiconductor substrate to define a first active region in the cell array area and define second and third active regions in the peripheral circuit area;

sequentially forming a tunnel oxide layer, a silicon nitride layer and a top oxide layer on the resultant structure having the isolation layer;

patterning the top oxide layer, the silicon nitride layer and the tunnel oxide layer to form a cell gate insulation layer having a tunnel oxide layer pattern, a silicon nitride layer pattern and a top oxide layer pattern, which are sequentially stacked on a first area of the first active region and expose a second area of the first active region, the second active region and the third active region;

forming a first gate insulation layer on the exposed second area of the first active region, the exposed second active region and the exposed third active region;

patterning the first gate insulation layer to expose the second area of the first active region and the second active region; and forming a second gate insulation layer on the exposed second area of the first active region and the exposed second region, the second gate insulation layer having a thickness less than equivalent oxide thickness of the cell gate insulation layer.

2. The method of claim 1, wherein the second gate insulation layer is thinner than the first gate insulation layer.

3. The method of claim 1, further comprising:

forming a first well in the semiconductor substrate in the cell array area;

forming a pocket well surrounded by the first well; and forming a second well surrounding the second active region in the semiconductor substrate within the peripheral circuit area.

4. The method of claim 1, further comprising:

forming a conductive layer on the resultant structure where the second gate insulation layer is formed; and patterning the conductive layer to form a selection gate electrode crossing over the second area of the first active region, a cell gate electrode crossing over the first area of the first active region, a low-voltage gate electrode crossing over the second active region and a high-voltage gate electrode crossing over the third active region.

5. A method for fabricating a non-volatile memory device on a semiconductor substrate having a cell array area and a peripheral circuit area, the method comprising:

forming an isolation layer on the semiconductor substrate to define a first active region in the cell array area and define a second active region and a third active region in the peripheral circuit area;

forming a tunnel oxide layer, a silicon nitride layer and a top oxide layer on the semiconductor substrate having the isolation layer;

patterning the top oxide layer, the silicon nitride layer and the tunnel oxide layer to form a cell gate insulation layer having a tunnel oxide layer pattern, a silicon nitride layer pattern and a top oxide layer pattern, which are sequentially stacked on the first active region, and expose the second active region and the third active region;

forming a first gate insulation layer on the exposed second active region and the exposed third active region;

patterning the first gate insulation layer to expose the second active region; and forming a second gate insulation layer on the exposed second active region, the second gate insulation layer having a thickness less than equivalent oxide thickness of the cell gate insulation layer.

6. The method of claim 5, wherein the second gate insulation layer is thinner than the first gate insulation layer.

7. The method of claim 5, further comprising:

forming a first well in the semiconductor substrate within the cell array area;

forming a pocket well surrounded by the first well; and forming a second well surrounding the second active region in the semiconductor substrate within the peripheral circuit area.

8. The method of claim 5, further comprising:

forming a conductive layer on the resultant structure having the second gate insulation layer; and patterning the conductive layer to form a cell gate electrode crossing over a first area of the first active region, a selection gate electrode crossing over a second area of the first active region, a low-voltage gate electrode crossing over the second active region and a high-voltage gate electrode crossing over the third active region.

* * * * *

UNITED STATES PATENT AND TRADEMARK OFFICE
CERTIFICATE OF CORRECTION

PATENT NO. : 6,734,065 B2
DATED : May 11, 2004
INVENTOR(S) : Yim et al.

It is certified that error appears in the above-identified patent and that said Letters Patent is hereby corrected as shown below:

Column 7,
Line 42, "electrode 231 crossing" should read -- electrode 23*l* crossing --.

Column 10,
Line 25, "than equivalent oxide" should read -- than an equivalent oxide --.

Column 11,
Line 3, "than equivalent oxide" should read -- than an equivalent oxide --.

Signed and Sealed this

Seventh Day of December, 2004

JON W. DUDAS
*Director of the United States Patent and Trademark Office*